(12) United States Patent
Rosen et al.

(10) Patent No.: US 6,639,809 B1
(45) Date of Patent: Oct. 28, 2003

(54) PHOTODIODE/LASER MOUNTING BRACKET

(75) Inventors: Brett Rosen, Richboro, PA (US); Robert Joseph Chilton, III, Abington, PA (US); Warren Panama Johnson, Wilmington, DE (US)

(73) Assignee: General Instrument Corporation, Horsham, PA (US)

( * ) Notice: Subject to any disclaimer, the term of this patent is extended or adjusted under 35 U.S.C. 154(b) by 40 days.

(21) Appl. No.: 09/697,619

(22) Filed: Oct. 26, 2000

(51) Int. Cl.⁷ .................................................. H02B 1/01
(52) U.S. Cl. ....................................... 361/825; 361/807
(58) Field of Search ................................. 361/725–727, 361/807–810, 824–830; 439/359–362

(56) References Cited

U.S. PATENT DOCUMENTS

| | | | |
|---|---|---|---|
| 5,475,570 A | * 12/1995 | Harr | ............................ 361/825 |
| 6,062,914 A | * 5/2000 | Fasano | ........................ 439/716 |
| 6,151,221 A | * 11/2000 | Van Lerberghe | ............ 361/774 |
| 6,233,159 B1 | * 5/2001 | Harman et al. | ............. 361/825 |

* cited by examiner

Primary Examiner—Kamand Cuneo
Assistant Examiner—Tuan Dinh
(74) Attorney, Agent, or Firm—Mayer Fortkort & Williams, PC; Karin L. Willimas, Esq.

(57) ABSTRACT

An apparatus and method for mounting an electronic component device directly to a plug in board within an electronic product thereby eliminating differential movement between the mounting surface of a mounting bracket holding an electrical component device, and the plug in board to which the component device is attached during transportation or use. By eliminating differential/relative movement between the anchoring surface of the mounting bracket and the plug in board commonly found in conventional applications, the stresses generated by differential movement of the connection leads of the mounted component device, relative to the plug in board, and the concomitant potential for degradation of component device performance resulting therefrom, are eliminated.

16 Claims, 1 Drawing Sheet

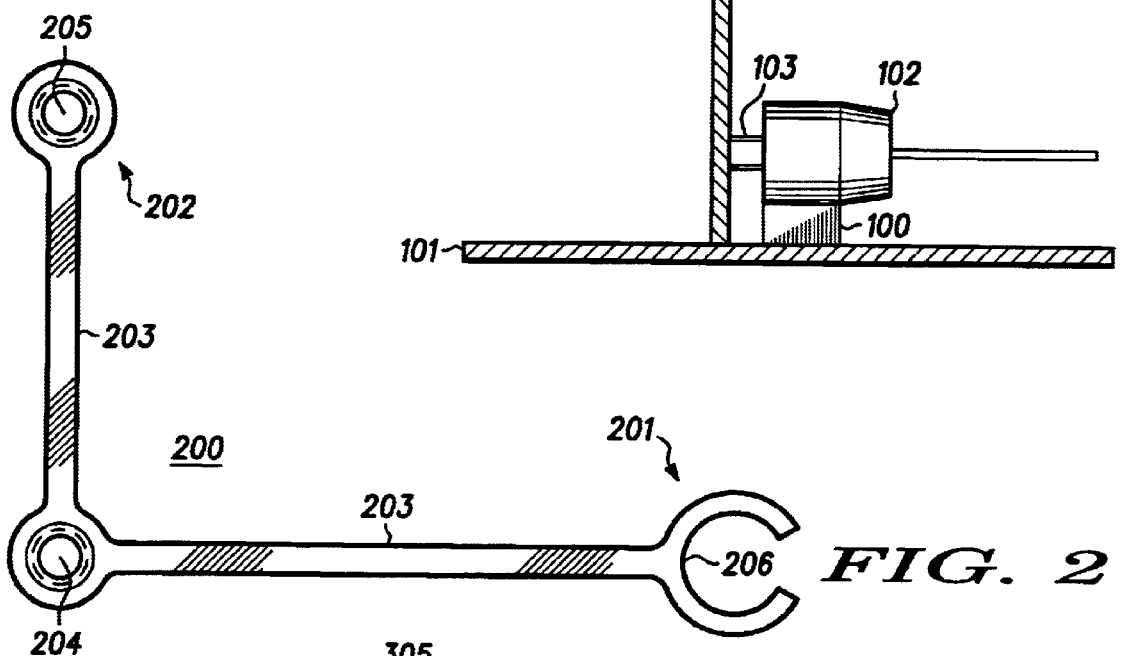
*FIG. 1*
- *PRIOR ART* -
*FIG. 2*
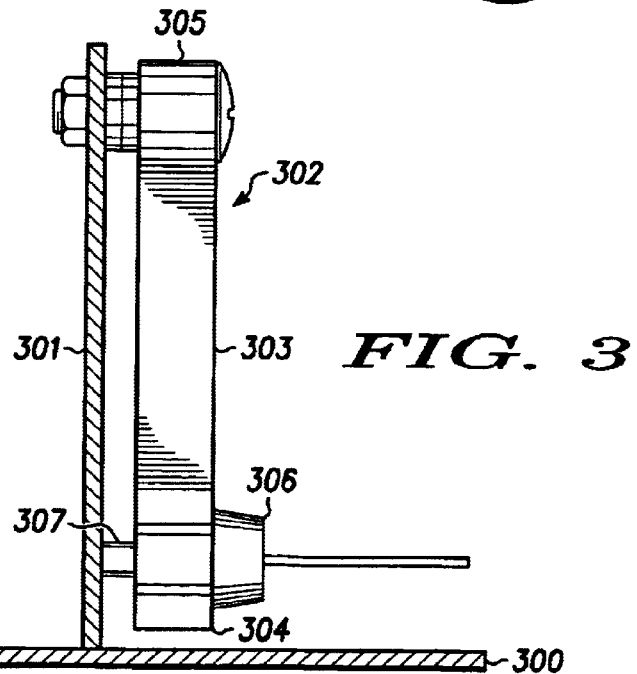
*FIG. 3*

PHOTODIODE/LASER MOUNTING BRACKET

FIELD OF THE INVENTION

The present invention relates generally to an apparatus and method for the assembly of electrical components and circuitry in the manufacture of electronic products.

BACKGROUND OF THE INVENTION

In the manufacture of electronic equipment and appliances it is common to connect component devices such as photodiodes and lasers, for example, to circuit boards commonly termed "plug in" boards. An example of such a plug in board is a transimpedance amplifier (TIA) used in CATV-RF Broadband applications. Plug in boards permit ease of assembly or replacement and a means by which component devices in an electronic product are integrated into the circuitry of the product.

Typically, the component device to be connected to the plug in board is mounted on a bracket that is in turn mounted or anchored remotely from the plug in board on a surface such as the motherboard of the product, for example. An example of such a bracket is the "Universal" mounting bracket manufactured by the AMP Corporation. The bracket is fabricated such that when a component device is mounted in it, the component device can be easily positioned relative to, and connected to the plug in board.

In certain applications, however, the use of a "universal" type mounting bracket has some drawbacks in its application, particularly with respect to the mounting location of the mounting bracket. For example, in CATV-RF Broadband applications, products include photodiodes and lasers. These component devices are mounted on a bracket such as the "universal" bracket described above which is in turn mounted on the mother board of the product, and electrical leads from the photodiode or laser are connected to a remotely located plug in board, thereby integrating the component devices into the circuitry of the subject product. During product transportation, or normal use, however, the plug in board is capable of movement independent of the mounting bracket to which the component device is attached. This relative or differential movement between the surface to which the mounting bracket is anchored and thus the bracket itself, and the plug in board to which the mounted component device is connected, leads to undesirable relative movement and stress on the connections between the component device and the plug in board to which it is connected. The differential movement has been known to cause degradation in the performance of the photodiode or laser connected to the plug in board and, in some instances, a complete separation of the contact leads of the mounted component device from the plug in board. It is desirable, therefore, to have an electrical component device mounting system that will eliminate such differential movement and be unaffected by movement in a plug in board during product shipment or use, while maintaining all component device performance and layout criteria.

SUMMARY OF THE INVENTION

The present invention solves these and other problems by providing a method and apparatus for mounting an electronic component device directly to a plug in board thereby eliminating differential movement between the mounting surface of the bracket holding the component device, and the plug in board to which the component device is connected, during either transportation or normal use. By eliminating the differential/relative movement between the anchoring surface of the mounting bracket and the plug in board, the stresses generated by movement of the connection leads from the component device relative to the plug in board and the potential consequences thereof, are eliminated.

BRIEF DESCRIPTION OF THE DRAWINGS

FIG. 1 shows a photodiode mounted on a conventional mounting bracket that is anchored remotely from a plug in board;

FIG. 2 shows a mounting bracket fabricated according to a preferred embodiment of the present invention; and FIG. 3 shows a photodiode device mounted in accordance with a preferred embodiment of the present invention.

DETAILED DESCRIPTION

The present invention includes inter alia an apparatus and method for mounting electrical component devices directly onto a plug in board of an electrical product. As discussed above, conventional methods for mounting electronic component devices are prone to differential movement of the components during transportation or use.

At this point it is worthy to note that any reference herein to "one embodiment" or an "embodiment" means that a particular feature, structure, or characteristic described in connection with the embodiment is included in at least one embodiment of the invention. The appearances of the phrase "in a preferred embodiment" in various places herein do not necessarily refer to the same embodiment.

FIG. 1 shows a typical use of a conventional mounting bracket. As shown in FIG. 1, a mounting bracket 100 is mounted on a motherboard 101. Removably mounted on the bracket 100 is a photodiode device 102, comprising leads 103, which are connected to a plug in circuit board 104. As can be seen from FIG. 1, should there be any movement of the plug in board 104, relative to the motherboard 101, undue stress could be placed on the leads 103 by virtue of the displacement of board 104, relative to the motherboard 101, possibly leading to deterioration of electrical contact of the leads 103 with the plug in board 104 and possible total loss of contact with the plug in board 104.

FIG. 2 shows a mounting bracket fabricated according to a preferred embodiment of the present invention. As shown in FIG. 2, a mounting bracket 200 comprises a first end 201, a second end 202 disposed at a right angle to the first end 201. The first end 201, and second end 202, of the bracket 200, are connected to each other by a shaft 203, forming a right angle and having a first mounting point 204 and a second mounting point 205 disposed along its length. The first mounting point 204, and second mounting point 205 serve as means, through which the bracket 200 is removably attached to a mounting surface (not shown). The first end 201 of the mounting bracket 200 is substantially semi-circular in shape with an inner surface 206 to permit an electrical component device to be removably mounted within the confines formed by the inner surface 206. In a preferred embodiment of the present invention, the mounting bracket 200 is preferably fabricated by an Aluminum 6005-T5 extrusion with a caustic etch and clear chromate finish.

FIG. 3 shows the mounting bracket shown in FIG. 2 utilized according to a preferred embodiment of the present invention. As shown in FIG. 3, a motherboard 300, is disposed adjacent to a plug in circuit board 301. A mounting bracket 302 according to a preferred embodiment of the present invention comprises a shaft 303 with a first end 304, and a second end 305 and is removably attached to the plug in board 301 by attachment means (not shown) through a hole disposed in the vicinity of the second end 305 of the shaft 303. The first end 304 contains a photodiode device 306, which further comprises leads 307, removably mounted within the first end 304. The leads 307 are connected to the plug in board 301, thereby incorporating the photodiode device 306 into the circuitry of the product of which the motherboard 300 and plug in board 301 are a part. In a preferred embodiment of the present invention, the orientation of the mounting bracket 302 is selected to ensure that the mounted component device such as a photodiode or laser conforms to the requirements of the fiber bend radius rule for fiber-optic devices. Moreover, in a preferred embodiment the clearance of the bracket 302 from the plug in board is taken into account during fabrication so as to provide adequate clearance of the photodiode device from the surface of the plug in board 301.

By mounting the entire bracket structure 302 and the photodiode device 306 directly on the plug in board 301, grounding of the photodiode device is ensured. Moreover, any movement of the plug in board 301 will be accompanied by an equal and corresponding movement in the bracket structure 302. Accordingly, there is no relative movement between the bracket structure 302, and the plug in board 301 and the stresses generated on the leads of component devices mounted conventionally, i.e. remotely from, and connected to, a plug in board are thereby eliminated.

Although the present invention has been described in considerable detail with reference to certain preferred versions thereof, other versions are possible. For example, the mounting bracket may be fabricated without a right-angled shaft, or more than one mounting point. Therefore, the spirit and scope of the invention of the appended claims should not be limited to the description of the preferred versions contained herein.

The reader's attention is directed to all papers and documents which are filed concurrently with this specification and which are open to public inspection in conjunction with this specification, and the contents of all such papers and documents are incorporated herein by reference.

All the features disclosed in this specification (including any accompanying claims, abstract and drawings), and/or all of the steps or any method or process so disclosed, may be combined in any combination, except combinations where at least some of the features and/or steps are mutually exclusive.

Each feature disclosed in this specification (including any accompanying claims, abstract, and drawings), may be replaced by alternative features serving the same equivalent or similar purpose, unless expressly stated otherwise. Thus, unless expressly stated otherwise, each feature disclosed is one example only of a generic series of equivalent or similar features.

What is claimed is:

1. A bracket for mounting an electrical component device comprising:
   a first end, said first end having a substantially semi-circular shape and an inner and outer surface, whereby said inner surface and said substantially semi-circular shape permit an electrical component device, having a body portion and leads extending from the body portion, to be retained thereon;
   a second end; and
   a shaft connecting said first and second ends, said shaft having at least one mounting point for attaching said bracket to a mounting surface,
   wherein the body portion of the electrical component device is removably retained within said first end, and
   further wherein upon attaching said bracket to the mounting surface the body portion of the electrical component device does not contact the mounting surface on which said bracket is attached.

2. The bracket of claim 1 wherein the leads extending from the body portion of the electrical component device are electrically connected to the mounting surface.

3. The bracket of claim 1 wherein the electrical component device is a photodiode.

4. The bracket of claim 1 wherein the electrical component device is a laser.

5. The bracket of claim 1 wherein said shaft and said first and second ends arc comprised of aluminum.

6. The bracket of claim 1 wherein said shaft forms a right angle whereby said second end and said at least one mounting point are disposed 90 degrees relative to said first end.

7. The bracket of claim 1 wherein the mounting surface comprises a plug in circuit board.

8. The bracket of claim 1 wherein the mounting surface comprises a Trans-Impedance-Amplifier.

9. A method for mounting an electrical component device comprising the steps of:
   mounting an electrical component device, having a body portion and leads extending from the body portion, on a mounting bracket, said bracket having a first end, the first end having a substantially semi-circular shape and an inner surface and an outer surface, wherein the inner surface and substantially semi-circular shape permit the electrical component device to be removably retained thereon, a second end and a shaft connecting the first and second ends; and
   attaching said mounting bracket at the mounting point to a mounting surface;
   wherein upon attaching said mounting bracket to the mounting surface, the body portion of the electrical component device contacts only the mounting bracket and does not contact the mounting surface on which said mounting bracket is attached.

10. The method of claim 9 further comprising the step of electrically connecting the leads extending from the body portion of the electrical component device to the mounting surface.

11. The method of claim 9 wherein the electrical component device is a photodiode.

12. The method of claim 9 wherein the electrical component device is a laser.

13. The method of claim 9 wherein said shaft and said first and second ends are comprised of aluminum.

14. The method of claim 9 wherein said shaft forms a right angle whereby said second end and said at least one mounting point are disposed 90 degrees relative to said first end.

15. The method of claim 9 wherein the mounting surface comprises a plug in circuit board.

16. The method of claim 9 wherein the mounting surface comprises a Trans-Impedance-Amplifier.

* * * * *